(12) United States Patent
Hara et al.

(10) Patent No.: US 8,098,531 B2
(45) Date of Patent: Jan. 17, 2012

(54) SEMICONDUCTOR MEMORY DEVICE

(75) Inventors: Kota Hara, Kawasaki (JP); Katsuhiro Mori, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/907,870

(22) Filed: Oct. 18, 2007

(65) Prior Publication Data

US 2008/0101129 A1    May 1, 2008

(30) Foreign Application Priority Data

Oct. 31, 2006    (JP) ................................. 2006-296410

(51) Int. Cl.
*G11C 7/00*    (2006.01)
*G11C 8/00*    (2006.01)

(52) U.S. Cl. ............... 365/189.05; 365/194; 365/230.06; 365/230.08

(58) Field of Classification Search ............. 365/189.05, 365/194, 226, 230.03, 230.06, 189.02, 230.08, 365/189.07

See application file for complete search history.

(56) References Cited

U.S. PATENT DOCUMENTS

| | | | |
|---|---|---|---|
| 6,442,644 B1 * | 8/2002 | Gustavson et al. | 365/194 |
| 6,498,762 B2 * | 12/2002 | Noda et al. | 365/226 |
| 6,633,508 B2 * | 10/2003 | Muranaka et al. | 365/230.03 |
| 6,788,588 B2 * | 9/2004 | Nagai et al. | 365/189.05 |
| 7,184,322 B2 * | 2/2007 | Takahashi et al. | 365/189.02 |

FOREIGN PATENT DOCUMENTS

| | | |
|---|---|---|
| JP | 55-089985 | 7/1980 |
| JP | 2006-202398 A | 8/2006 |

* cited by examiner

*Primary Examiner* — Trong Phan
(74) *Attorney, Agent, or Firm* — Arent Fox LLP

(57) ABSTRACT

In a semiconductor memory device which uses a same pad for an address input and data input/output, and has an input circuit and data output circuit connected to the pad, an output of the data output circuit is turned to a high impedance state in accordance with a chip enable signal, output enable signal, and address capture signal, at a stand-by time, output disable time, and address capture period, and thereby, it becomes possible to start an internal read operation even before the address capture period is finished, and a high-speed operation becomes possible.

15 Claims, 5 Drawing Sheets

F I G. 1
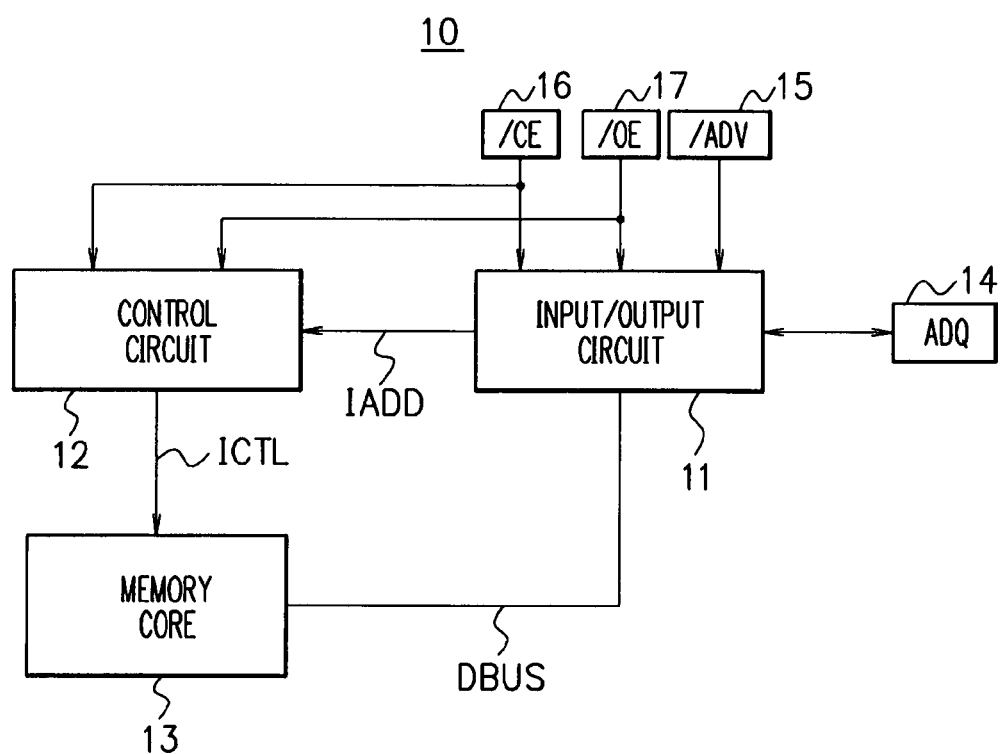

SEMICONDUCTOR MEMORY DEVICE

CROSS-REFERENCE TO RELATED APPLICATIONS

This application is based upon and claims the benefit of priority from the prior Japanese Patent Application No. 2006-296410, filed on Oct. 31, 2006, the entire contents of which are incorporated herein by reference.

BACKGROUND OF THE INVENTION

1. Field of the Invention

The present invention relates to a semiconductor memory device, and in particular, it is suitable for use in a semiconductor memory device in which a same pad is shared for an address input and data input/output.

2. Description of the Related Art

In a memory in recent years, there is the one in which a same pad is used to perform an input/output of an address and data to reduce the number of pads. In such memory, it is controlled such that the input of the address and the output of the data do not occur simultaneously in a read operation of data. Operational waveforms chart in a conventional data read operation is shown in FIG. 7.

At first, after a chip enable signal /CE changes from high level (hereinafter, referred to as "H") to low level (hereinafter, referred to as "L") at the time T11, an address valid signal (address capture signal) /ADV changes from "H" to "L" at the time T12. A memory captures an external address (ADDRESS) inside thereof, inputted from a shared pad of the address/data (ADQ) during a period when the address valid signal /ADV is "L" (times T12 to T13).

Subsequently, after the address valid signal /ADV turns to "H" at the time T13, an output enable signal /OE changes from "H" to "L" at the time T14, and thereby, the memory starts and performs an internal read operation. The memory outputs the data (DATA) read by the internal read operation to external from the shared pad of the address/data (ADQ) at the time T15 when a predetermined time elapses from the time T14 when the memory starts the internal read operation.

As stated above, the internal read operation is inhibited during the period when the address valid signal /ADV is "L", so that the input of the external address and the output of the read data do not occur simultaneously. A high impedance (Hi-Z) state of the output in the memory is released at the time when the internal read operation is started when both signals /CE, /OE are "L", to be a low impedance (Low-Z) state.

Besides, a semiconductor memory device, in which an input/output of address and data are performed by using a same pad, and an output is turned to a Hi-Z state at the time of writing of address from external, is described in Patent Document 1.

[Patent Document 1] Japanese Patent Application Laid-open No. Sho 55-89985

As stated above, in the memory performing the input/output of address and data by using the same pad, the Hi-Z state of the output is generally released to be the Low-Z state at time when the memory starts the internal read operation (both signals /CE, /OE are "L"). Besides, the external address is captured inside from the time when the address valid signal /ADV falls from "H" to "L", and therefore, it is not necessary to wait the start of the internal read operation until the address valid signal /ADV turns to "H" again from the point of view of an internal operation. It is preferable to start the internal read operation in early time to realize a high-speed operation.

However, when the memory starts the internal read operation before the address valid signal /ADV turns to "H" again, a bus fight occurs as shown in FIG. 8, and therefore, it is impossible to turn the output in the memory to the Low-Z state when the external address is inputted from a controller side.

FIG. 8 is a view showing operational waveforms when it is assumed that the memory starts the internal read operation before the address valid signal /ADV turns to "H" again.

At first, after the chip enable signal /CE turns to "L" at the time T21, the address valid signal /ADV turns to "L" at the time T22, and the memory captures the external address (ADDRESS) inputted from the shared pad of address/data (ADQ) into inside thereof. The external address is supplied to the memory from the controller side during the period when the address valid signal /ADV is "L" (times T22 to T24).

Subsequently, at the time T23, the output enable signal /OE turns to "L", and thereby, the memory starts the internal read operation, and releases the Hi-Z state of the output to be the Low-Z state. At the time T24, the address valid signal /ADV turns to "H". At the time T25 when a predetermined time elapses from the time T23 when the internal read operation is started, the memory outputs the data (DATA) read by the internal read operation from the shared pad of address/data (ADQ) to external.

As stated above, in the operation example shown in FIG. 8, the external address is inputted to the memory at the times T22 to T24, but after the time T23, the output of the memory becomes the Low-Z state by releasing the Hi-Z state thereof. Accordingly, the bus fight occurs during the period from the time T23 to the time T24. Besides, the bus fight may similarly occur when the address valid signal /ADV and the external address inputted to the memory delay caused by a load of a signal line.

Consequently, in the conventional memory, a margin must be provided in an interval from the end of the external address input to the start of the internal read operation, and the start of the internal read operation must be delayed.

SUMMARY OF THE INVENTION

An object of the present invention is to provide a semiconductor memory device using a same pad for an address input and data input/output, and a high-speed operation is enabled.

A semiconductor memory device of the present invention, includes an input circuit and a data output circuit connected to a pad shared for an address input and data input/output, in which the data output circuit is capable of outputting a read data read from a memory cell, and turns an output to a high impedance state at a stand-by time, output disable time, and address capture period.

According to the present invention, an input of an external address and an output of the read data do not overlap and a bus fight may not occur even if an internal read operation is started before the address capture period is finished because the output of the data output circuit is in the high impedance state during the address capture period.

BRIEF DESCRIPTION OF THE DRAWINGS

FIG. 1 is a view showing a configuration example of a semiconductor memory device according to an embodiment of the present invention;

DETAILED DESCRIPTION OF THE PREFERRED EMBODIMENTS

Figure 2:
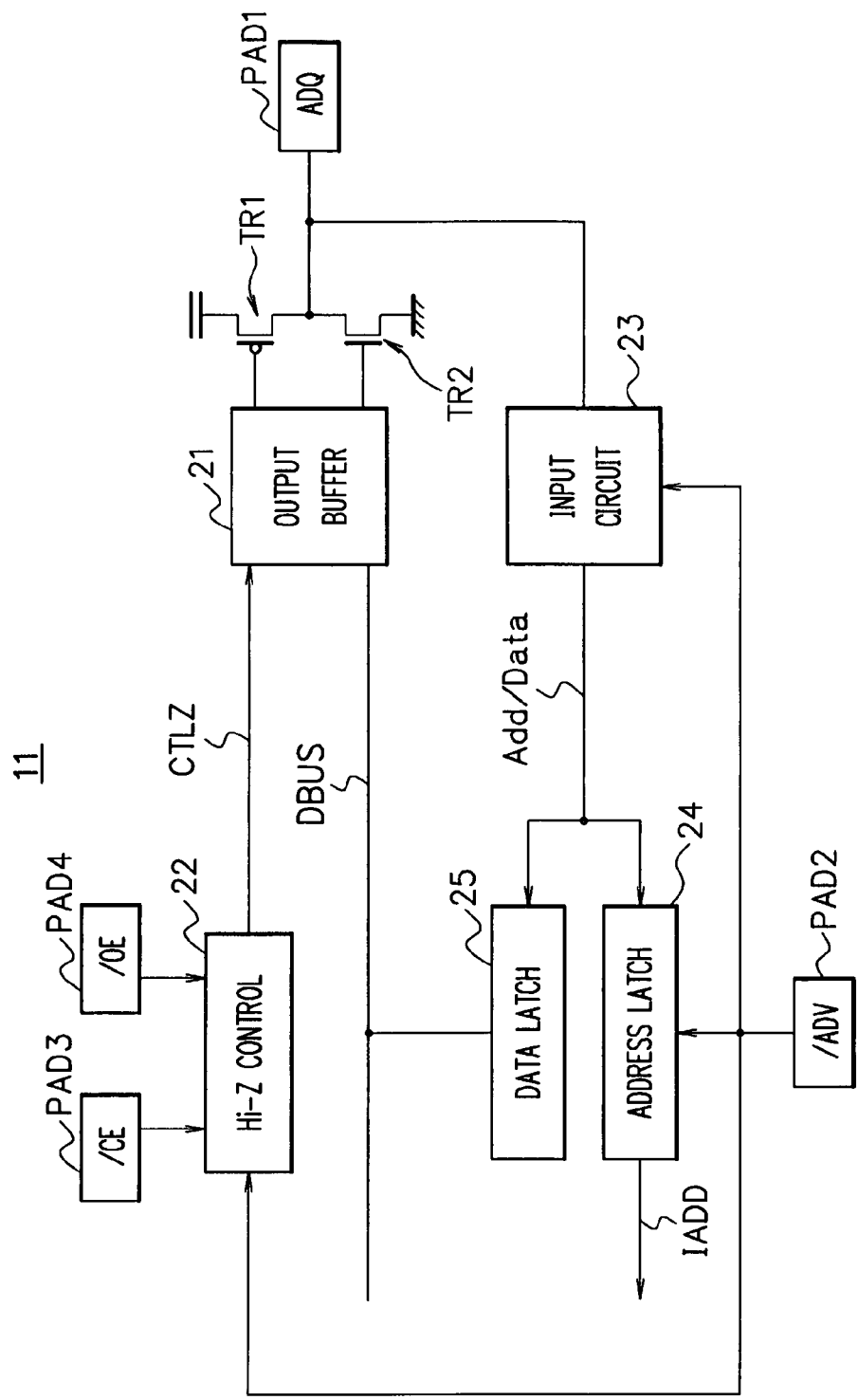
FIG. 2 is a view showing a configuration of an input/output circuit in the present embodiment.

Hereinafter, embodiments of the present invention are described based on the drawings.

FIG. 1 is a block diagram showing a configuration example of a semiconductor memory device 10 according to an embodiment of the present invention. The semiconductor memory device 10 in the present embodiment has an input/output circuit 11, a control circuit 12, a memory core 13, and plural pads 14, 15, 16, and 17.

The pad (ADQ) 14 is a pad which is shared for an address input and data input/output for the semiconductor memory device 10. The pad (/ADV) 15 is a pad to which an address valid signal (address capture signal) /ADV is inputted. The pad (/CE) 16 is a pad to which a chip enable signal /CE is inputted. The pad (/OE) 17 is a pad to which an output enable signal /OE is inputted.

The address, data, address valid signal /ADV, chip enable signal /CE, and output enable signal /OE inputted via the pads 14 to 17 are supplied from a not-shown controller. The address valid signal /ADV, chip enable signal /CE, and output enable signal /OE are negative logic signals.

Here, a period when the address valid signal /ADV is asserted, namely a period when the address valid signal /ADV is low level (hereinafter, referred to as "L") is called as an address capture period. A state in which the chip enable signal /CE is negated, namely a state in which the chip enable signal /CE is high level (hereinafter, referred to as "H") is called as a stand-by state. A state in which the chip enable signal /CE is "L", and the output enable signal /OE is "H" is called as an output disable state. A state in which both the chip enable signal /CE and the output enable signal /OE are "L" is called as an output enable state.

The input/output circuit 11 is connected to the pads 14 to 17. The input/output circuit 11 captures and latches the address (external address) inputted via the pad (ADQ) 14, based on the address valid signal /ADV inputted via the pad (/ADV) 15, and outputs the latched external address to the control circuit 12 as an internal address IADD.

Besides, the input/output circuit 11 outputs a data inputted via the pad (ADQ) 14 to the memory core 13 via a data bus DBUS, and outputs a data read from the memory core 13 and supplied via the data bus DBUS to external via the pad (ADQ) 14. Besides, the input/output circuit 11 turns the output for the pad (ADQ) 14 into a high impedance (Hi-Z) state in accordance with the address valid signal /ADV, chip enable signal /CE, and output enable signal /OE respectively inputted via the pads 15 to 17.

The control circuit 12 is connected to the pads 16, 17. The control circuit 12 generates an operation control signal ICTL for the memory core 13 based on the chip enable signal /CE and output enable signal /OE inputted via the pads 16, 17, and the internal address IADD supplied from the input/output circuit 11. The generated operation control signal ICTL is outputted to the memory core 13.

The memory core 13 has plural memory cells. The memory core 13 performs a read operation and write operation based on the operation control signal ICTL supplied from the control circuit 12. Namely, in the memory core 13, the data inputted via the data bus DBUS is written to the memory cell, and the data read from the memory cell is outputted via the data bus DBUS based on the operation control signal ICTL.

As the memory core 13, for example, a DRAM memory core can be cited as an example, in which each memory cell has a transfer transistor and a capacitor storing data, but it is arbitrary without being limited to this. In the present embodiment, the semiconductor memory device capable of reading/writing data from/to the memory cell of the memory core 13 is described as an example, but the present invention is applicable for a semiconductor memory device only capable of reading a data from the memory cell.

FIG. 2 is a block diagram showing a configuration of the input/output circuit 11.

As shown in FIG. 2, the input/output circuit 11 has an output buffer 21, a Hi-Z control circuit 22, an input circuit 23, an address latch 24, a data latch (input data latch) 25, a P-channel MOS transistor (hereinafter, referred to as a PMOS transistor) TR1, and an N-channel MOS transistor (hereinafter, referred to as an NMOS transistor) TR2.

In the PMOS transistor TR1, a power supply voltage is supplied to a source, and a drain thereof is connected to a drain of the NMOS transistor TR2. A source of the NMOS transistor TR2 is grounded. Gates of the PMOS transistor TR1 and the NMOS transistor TR2 are connected to the output buffer 21. A connection point of the drains of the PMOS transistor TR1 and the NMOS transistor TR2 are connected to a pad (ADQ) PAD1 which is shared for an address input and data input/output.

The data read from the memory cell of the memory core 13 is supplied via the data bus DBUS, and also a Hi-Z control signal CTLZ from the Hi-Z control circuit 22 is supplied to the output buffer 21. The output buffer 21 performs a drive control of the transistors TR1, TR2 in accordance with the supplied data and Hi-Z control signal CTLZ. A data output circuit of the present invention is constituted by the output buffer 21 and transistors TR1, TR2.

Concretely speaking, the output buffer 21 turns both transistors TR1, TR2 into off states when it is instructed to turn the output to the Hi-Z state by the Hi-Z control signal CTLZ. In other cases, electric potential in accordance with the data is outputted by selectively turning the transistors TR1, TR2 to on states in accordance with the supplied data, and thereby, the data is outputted as the read data via the pad (ADQ) PAD1.

The Hi-Z control circuit 22 is connected to a pad (/ADV) PAD2 to which the address valid signal /ADV is inputted, a pad (/CE) PAD3 to which the chip enable signal /CE is inputted, and a pad (/OE) PAD4 to which the output enable signal /OE is inputted. The Hi-Z control circuit 22 generates and outputs the Hi-Z control signal CTLZ based on the address valid signal /ADV, the chip enable signal /CE, and the output enable signal /OE inputted via these PAD2, PAD3, and PAD4. This Hi-Z control circuit 22 corresponds to an output control circuit of the present invention.

Figure 3:
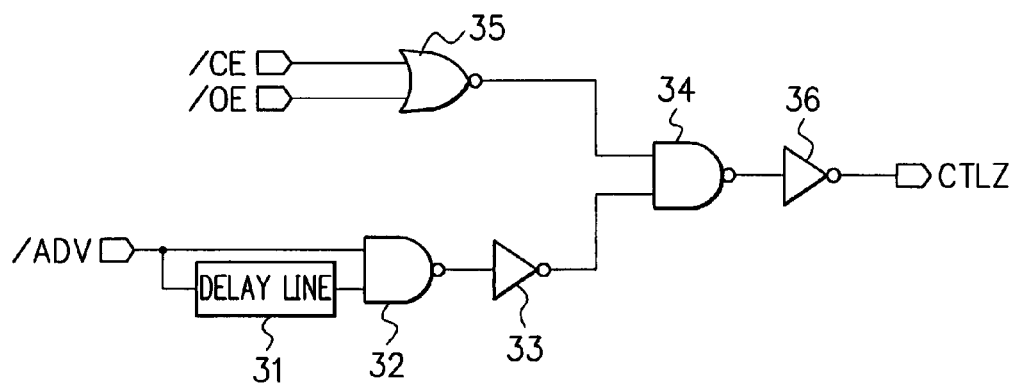
FIG. 3 is a view showing a configuration of a Hi-Z control circuit in the present embodiment.

FIG. 3 is a circuit diagram showing a configuration of the Hi-Z control circuit 22.

The address valid signal /ADV, and the address valid signal /ADV delayed for time DL by a delay line (delay circuit) 31 is inputted to an NAND circuit (negative logical product circuit) 32. An output of the NAND circuit 32 is inputted to an NAND circuit 34 via an inverter 33. The delay time DL by the delay line 31 is determined with considering hold time and so on of an external address.

The chip enable signal /CE and the output enable signal /OE are inputted to an NOR circuit (negative logical sum circuit) 35. An output of the NOR circuit 35 is inputted to the NAND circuit 34. An output of the NAND circuit 34 is outputted as the Hi-Z control signal CTLZ via an inverter 36.

In the Hi-Z control circuit 22 shown in FIG. 3, the Hi-Z control signal CTLZ becomes "L" when at least one of the chip enable signal /CE or the output enable signal /OE is "H", or when at least one of the inputs of the NAND circuit 32 is "L". When the Hi-Z control signal CTLZ is "L", the output buffer 21 shown in FIG. 2 turns both transistors TR1, TR2 into the off states, and turns the output to the Hi-Z state. A period when at least one of the inputs of the NAND circuit 32 becomes "L" is the period when the address valid signal /ADV is "L", and the period subsequent thereto, corresponding from the address valid signal /ADV changes from "L" to "H", to the delay time DL.

Namely, the Hi-Z control circuit 22 turns the Hi-Z control signal CTLZ into "L" at the address capture period, at the period corresponding to the delay time DL after the address capture period is finished, at a stand-by time and at an output disable time.

Returning to FIG. 2, the input circuit 23 outputs the address/data (Add/Data), supplied via the pad (ADQ) PAD1, to the address latch 24 and the data latch 25. The address latch 24 captures and latches the address from among the address/data supplied from the input circuit 23 based on the address valid signal /ADV inputted via the pad (/ADV) PAD2. The address latch 24 outputs the latched address as the internal address IADD. The data latch 25 latches the address/data supplied from the input circuit 23, to output to the data bus DBUS.

Here, in the present embodiment, the address valid signal /ADV is inputted to the input circuit 23 and the address latch 24 via the pad (/ADV) PAD2, and controls a portion concerning the address of the input circuit 23 and an operation of the address latch 24 in accordance with the address valid signal /ADV. Concretely speaking, the portion concerning the address of the input circuit 23 and the address latch 24 are inactivated to fix internal states thereof, and unnecessary consumption current is reduced during the period when the address valid signal /ADV is "H", namely when the period other than the address capture period. In other words, the portion concerning the address of the input circuit 23 and the address latch 24 are constituted such that the internal states thereof are changeable only for the period when the address valid signal /ADV is "L".

Figure 4:
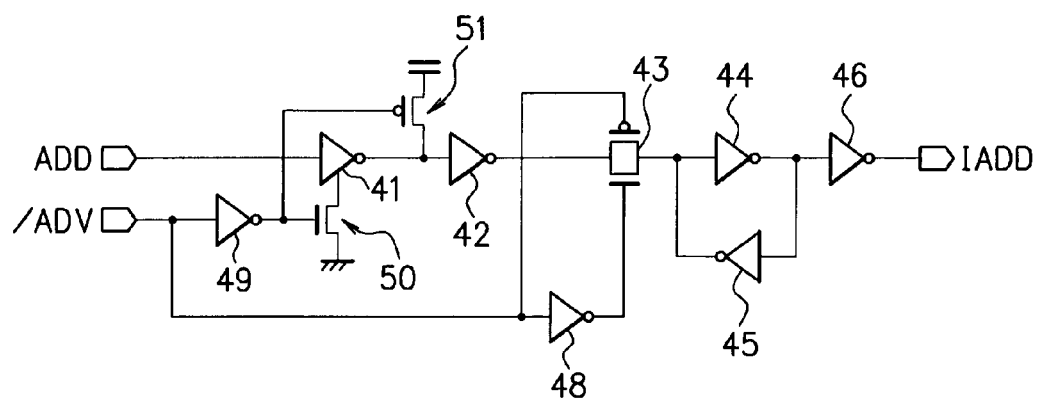
FIG. 4 is a view showing a configuration of an address input circuit in the present embodiment.

FIG. 4 is a circuit diagram showing configurations of the portion concerning the address of the input circuit 23 and the address latch 24, and they correspond to an address input circuit.

The address ADD inputted via the pad (ADQ) PAD1 is inputted to an inverter 42 via an inverter 41. An output of the inverter 42 is inputted to an inverter 44 via a transfer gate 43 constituted by a pair of PMOS transistor and NMOS transistor. An output end of the inverter 44 and an input end of an inverter 45 are connected, and an output end of the inverter 45 and an input end of the inverter 44 are connected. Namely, a latch circuit is constituted by the inverters 44, 45. An output of the inverter 44 is outputted as the internal address IADD via an inverter 46.

The address valid signal /ADV inputted via the pad (/ADV) PAD2 is supplied to a gate of the PMOS transistor constituting the transfer gate 43, and also supplied to a gate of the NMOS transistor constituting the transfer gate 43 via an inverter 48. Besides, the address valid signal /ADV is supplied to a gate of an NMOS transistor 50 and also to a gate of a PMOS transistor 51 via an inverter 49.

In the NMOS transistor 50, a source is grounded, and a drain is connected to the inverter 41. In the PMOS transistor 51, power supply voltage is supplied to a source, and a drain is connected to an input end of the inverter 42.

Consequently, when the address valid signal /ADV is "L", the transfer gate 43 becomes the on state and the NMOS transistor 50 becomes the on state to operate the inverter 41 at an initial stage, in the circuit shown in FIG. 4. Besides, the PMOS transistor 51 is in the off state. Accordingly, the address ADD inputted via the pad (ADQ) PAD1 is latched by the latch circuit constituted by the inverters 44, 45, and outputted as the internal address IADD.

On the other hand, when the address valid signal /ADV is "H", the transfer gate 43 becomes the off state and the NMOS transistor 50 becomes the off state to inactivate the initial stage inverter 41. Besides, the PMOS transistor 51 becomes the on state, and the input of the inverter 42 is fixed to "H". Incidentally, the latch circuit constituted by the inverters 44, 45 keeps the state thereof because the transfer gate 43 is in the off state. The unnecessary operations are surely stopped and the consumption current is reduced by inactivating the initial stage inverter 41, electrically disconnecting a connection between the pad PAD1, and shutting off the address input from external.

Next, operations are described.

Figure 5:
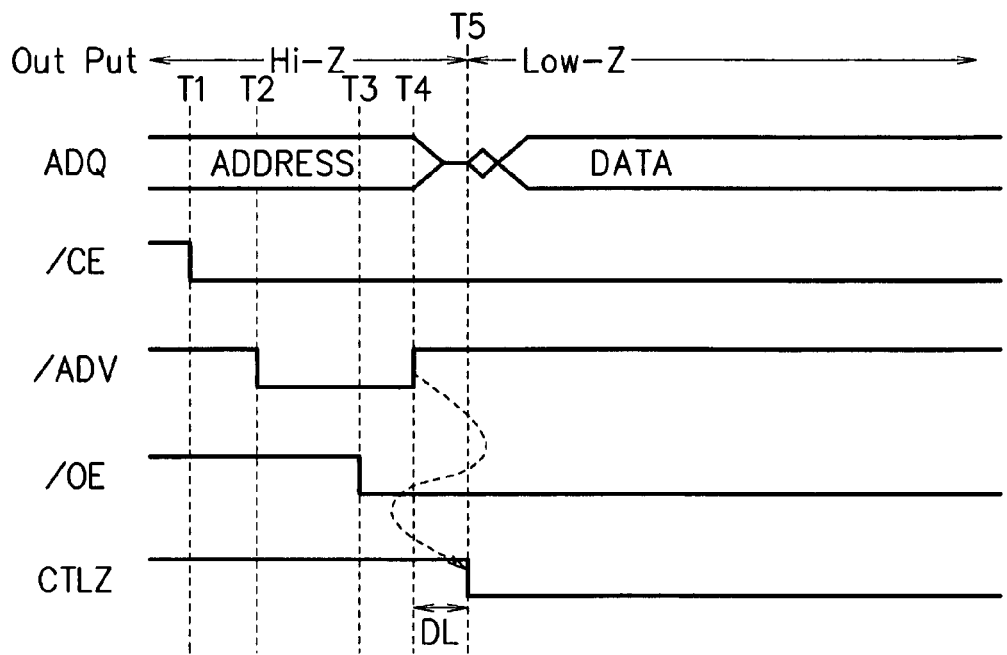
FIG. 5 is a view showing operational waveforms in the semiconductor memory device according to the present embodiment.

FIG. 5 is a view showing operational waveforms of a data read operation in the present embodiment.

All of the chip enable signal /CE, the output enable signal /OE, and the address valid signal /ADV are "H" (stand-by state) and the Hi-Z control signal CTLZ outputted from the Hi-Z control circuit 22 is "L" before the chip enable signal /CE turns to "L" at the time T1. Accordingly, the output is in the Hi-Z state.

At first, the chip enable signal /CE turns to "L" at the time T1. At this time, the output enable signal /OE is "H", and therefore, the Hi-Z control signal CTLZ outputted from the Hi-Z control circuit 22 maintains to be "L", and the output is in the Hi-Z state.

Next, the address valid signal /ADV turns to "L" at the time T2, and thereby, the external address (ADDRESS) inputted from the pad (ADQ) PAD1 is captured by the address latch 24 via the input circuit 23. At this time, the Hi-Z control signal CTLZ outputted from the Hi-Z control circuit 22 maintains to be "L" and the output is in the Hi-Z state, because the address valid signal /ADV turns to "L".

Subsequently, the output enable signal /OE turns to "L" at the time T3, and thereby, the internal read operation is started. At this time, the chip enable signal /CE and the output enable signal /OE become "L", and therefore, it becomes an output enable state, but the address valid signal /ADV is "L", and therefore, the Hi-Z control signal CTLZ outputted from the Hi-Z control circuit 22 maintains to be "L". Accordingly, the output is still in the Hi-Z state.

The address valid signal /ADV turns to "H" at the time T4. However, the Hi-Z control signal CTLZ outputted from the Hi-Z control circuit 22 maintains to be "L", and the Hi-Z control signal CTLZ outputted from the Hi-Z control circuit 22 changes to "H" at the time T5 when the delay time DL resulting from the delay line 31 elapses from the time T4. Accordingly, the output is released from the Hi-Z state to turn to the Low-Z state, and the data read by the internal read operation is outputted from the pad (ADQ) PAD1 to external as the read data (DATA).

As stated above, according to the present embodiment, the data output is turned to the Hi-Z state when the semiconductor memory device is in the stand-by time, output disable time, and address capture period, based on the address valid signal /ADV in addition to the chip enable signal /CE and the output enable signal /OE. Accordingly, the address input and the data output intervened by the same pad do not overlap, and the internal read operation can be started during the period when the address valid signal /ADV is "L", namely, before the address capture period is finished. Consequently, the high-speed operation becomes possible compared to the conventional one.

Figure 6:
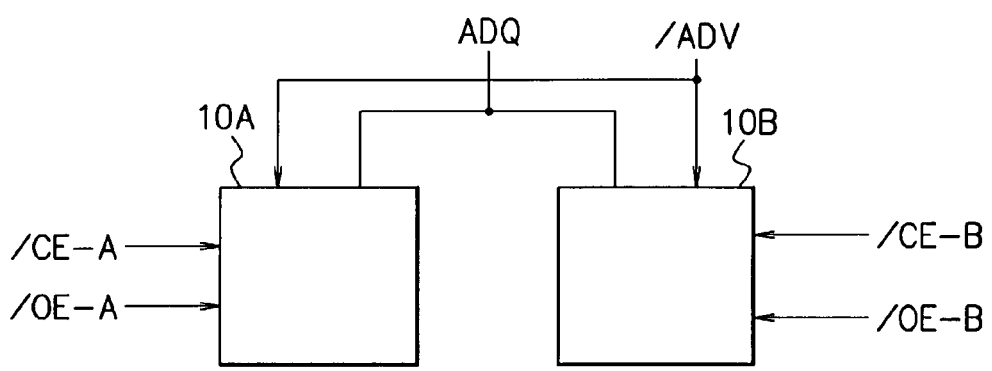
FIG. 6 is a view showing a configuration example of a memory system using the semiconductor memory devices according to the present embodiment.
Figure 7:
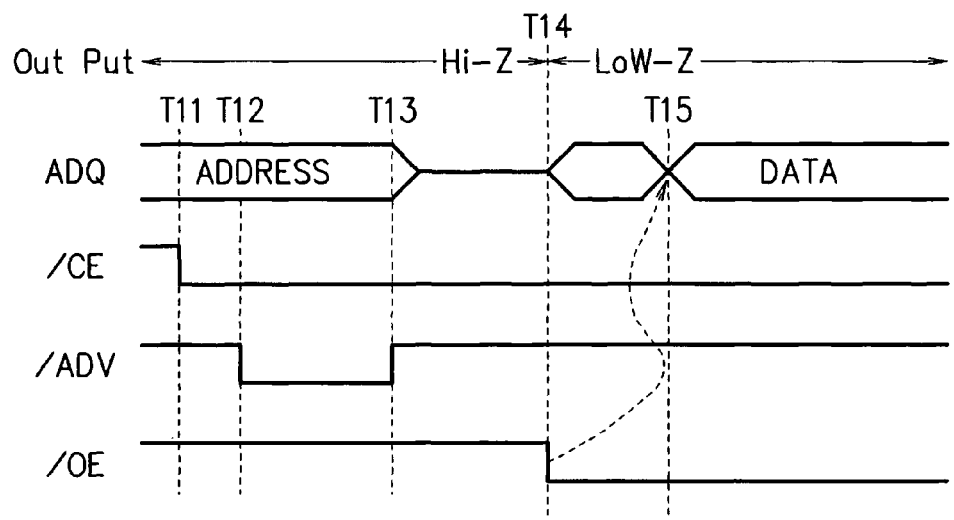
FIG. 7 is a view showing operational waveforms of a conventional semiconductor memory device.
Figure 8:
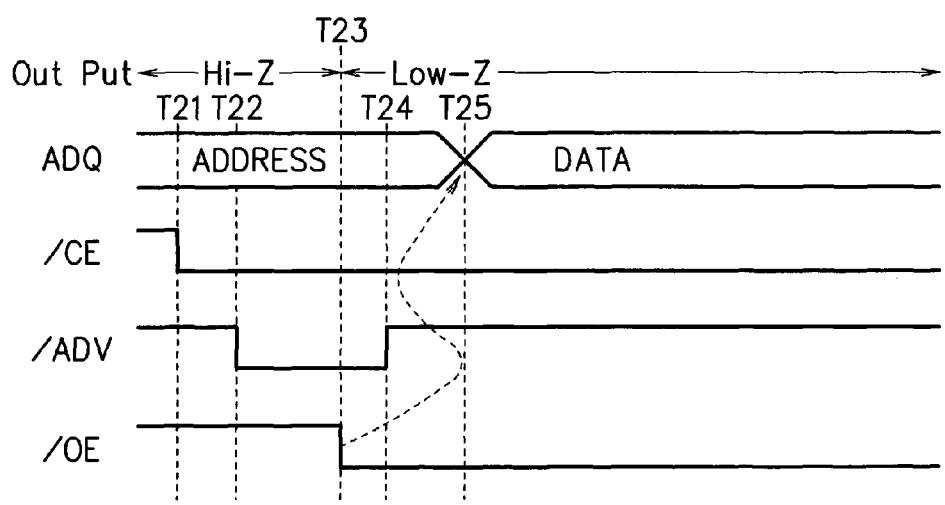
FIG. 8 is a view for explaining problems in the conventional semiconductor memory device.

Besides, a control whether the data output is turned to the Hi-Z state or not is performed via a control of two systems: a control based on the chip enable signal /CE and the output enable signal /OE; and a control based on the address valid signal /ADV, and thereby, it becomes possible to control the data outputs of respective semiconductor memory devices independently in a memory system in which plural semiconductor memory devices are used as shown in FIG. 6.

FIG. 6 is a view showing a configuration example of the memory system in which the plural semiconductor memory devices according to the present embodiment are used.

In FIG. 6, semiconductor memory devices 10A, 10B respectively correspond to the semiconductor memory device 10 shown in FIG. 1. The semiconductor memory devices 10A and 10B share an address/data wire ADQ and the address valid signal /ADV. A chip enable signal /CE-A and an output enable signal /OE-A are inputted to the semiconductor memory device 10A. A chip enable signal /CE-B and an output enable signal /OE-B are inputted to the semiconductor memory device 10B. The chip enable signal /CE-A and chip enable signal /CE-B are different, and the output enable signal /OE-A and output enable signal /OE-B are different.

As stated above, it is possible to control the data outputs independently by the respective semiconductor memory devices based on the individual chip enable signals /CE-A, /CE-B, and output enable signals /OE-A, /OE-B respectively, even if the address valid signal /ADV is shared by the plural semiconductor memory devices.

Incidentally, the above-stated embodiment is to be considered in all respects as illustrative and no restrictive. Namely, the present invention may be embodied in other specific forms without departing from the spirit or essential characteristics thereof.

According to the present invention, it becomes possible to prevent that the address input and data output via the shared pad occur simultaneously, and to start the internal read operation even before the address capture period is finished, by turning the output of the data output circuit into the high impedance state during the address capture period. Accordingly, it is not necessary to wait the start of the internal read operation until the address capture period is finished as in the conventional method, and the high-speed operation becomes possible.

What is claimed is:

1. A semiconductor memory device, comprising:
a memory core having plural memory cells for storing data;
a pad which receives an input address and outputs output data, wherein the pad receives the input address when an address capture signal allowing the input address to input is activated and the pad outputs the output data when the address capture signal is deactivated;
an input circuit connected to the pad; and
a data output circuit connected to the pad which outputs a read data read from one of the plural memory cells, and turns an output to a high impedance state at an address capture period when the address capture signal is activated,
wherein the input circuit includes an address input circuit for receiving the input address and a data input circuit for receiving input data, and
wherein the address input circuit is deactivated when the address capture signal is deactivated.

2. The semiconductor memory device according to claim 1, wherein the data output circuit releases the high impedance state to enable an output of the read data during a period when a given time elapses after the address capture period is finished, and
wherein the given time is determined based on a hold time for capturing the input address.

3. The semiconductor memory device according to claim 1, further comprising:
an output control circuit turning an output of the data output circuit into the high impedance state based on control signals instructing a read operation.

4. The semiconductor memory device according to claim 3, wherein the control signals are a chip enable signal, an output enable signal, and an address capture signal.

5. The semiconductor memory device according to claim 4, wherein the output control circuit turns the output of the data output circuit to the high impedance state when at least one of the chip enable signal or the output enable signal is negated, or when the address capture signal is asserted.

6. The semiconductor memory device according to claim 1, wherein the address input circuit is activated during the address capture period.

7. The semiconductor memory device according to claim 1, wherein the data output circuit turns the output to a high impedance state at one of a stand-by time when a chip enable signal is disenabled and an output disable time when an output enable signal is disenabled.

8. A semiconductor memory device, comprising:
a pad though which an address and input data are input and output data is output;
an address input circuit capturing the address inputted via the pad when an address capture signal allowing the address to input is asserted; and
a data output circuit outputting a read data read from the memory cell via the pad, when the address capture signal is negated,
wherein the data output circuit turns an output to a high impedance state during a period when the address capture signal is asserted, and
wherein the address input circuit is deactivated when the address capture signal is deactivated.

9. The semiconductor memory device according to claim 8, further comprising:
an output control circuit generating a control signal which turns an output of the data output circuit into the high impedance state based on the address capture signal, the chip enable signal, and the output enable signal, and outputting the control signal to the data output circuit.

10. The semiconductor memory device according to claim 8, wherein the data output circuit keeps the output in the high impedance state until a given time elapses after the asserted address capture signal is negated,
wherein the given time is determined based on a hold time for capturing the input address.

11. The semiconductor memory device according to claim 8, wherein the data output circuit turns the output to the high impedance state during a period when the address capture signal which is further delayed for a given time determined based on a hold time for capturing the input address is asserted.

12. The semiconductor memory device according to claim 8, wherein the address input circuit is deactivated when the address capture signal is negated.

13. The semiconductor memory device according to claim 8, wherein the address input circuit shuts out an address input from external of the semiconductor memory device when the address capture signal is negated.

14. The semiconductor memory device according to claim 8, wherein the address input circuit electrically disconnects a connection with the pad when the address capture signal is negated.

15. The semiconductor memory device according to claim 8, wherein the data output circuit turns the output to a high impedance state during one of a period when a chip enable signal is negated and a period when an output enable signal is negated.

* * * * *